July 18, 1972 M. R. LORENZ 3,677,836

LIQUID EPITAXY METHOD OF FABRICATING CONTROLLED BAND GAP G A AS ELECTROLUMINESCENT DEVICES

Filed Sept. 23, 1969 3 Sheets-Sheet 1

INVENTOR
MAX R. LORENZ

BY John E Dougherty Jr

ATTORNEY 3,677,836

LIQUID EPITAXY METHOD OF FABRICATING CONTROLLED BAND GAP GaAl AS ELECTROLUMINESCENT DEVICES

Max R. Lorenz, Mahopac, N.Y., assignor to International Business Machines Corporation, Armonk, N.Y.

Filed Sept. 23, 1969, Ser. No. 860,355
Int. Cl. H02l *7/38;* H05b *33/00;* H01s *3/18*
U.S. Cl. 148—171 6 Claims

ABSTRACT OF THE DISCLOSURE

The electroluminescent diodes are fabricated of gallium aluminum arsenide in which the band gap is controlled during the growth to provide improved efficiency devices. The bodies are grown by liquid phase epitaxy so that there is a centrally located region of constant band gap adjacent the junction in which the recombination radiation takes place. In the regions extending from this recombination radiation region in both directions to the opposite surfaces of the diode, the band gap is larger. The variation in band gap is achieved by controlling the temperature during the growth as well as by adding aluminum to the melt and a portion of the device is grown isothermally.

BACKGROUND OF THE INVENTION

Field of the invention

This invention relates to semiconductor electroluminescent diodes formed of alloys of a semiconductor in which the band gap is varied along the width of the device in a direction essentially perpendicular to the direction in which the junction extends. The invention also relates to a method of growing semiconductor bodies for such devices, particularly alloys including at least three elements, by liquid phase epitaxy.

DESCRIPTION OF THE PRIOR ART

Electroluminescent diodes have been fabricated of crystals of elemental, compound and alloy semiconductors and semiconductor crystals for such devices have been grown by liquid phase epitaxy. It has also been known that the p type region in such devices is usually the most highly absorbing but that absorption also takes place in the n type region. Further, devices have been built by epitaxial methods in which the band gap in the n type region extending in one direction along the width of the devices from the junction to one surface has a higher band gap to minimize light absorption in that region due to band to band and near band to band transitions. Light emitting diodes have also been fabricated in which the band gap has been varied along the length of the junction so that light outputs of different frequencies are obtained. In injection laser devices, internal sidewall confining interfaces for the laser cavity have been fabricated by changing either the impurity concentration or band gap since these changes produce a change in index of refraction.

It is also known that when semiconductor crystals are grown of semiconductor alloys of two binary compounds such as GaAs and AlAs, the band gap and, therefore, the frequency of the light output depends upon the composition of the material in the recombination radiation region in the vicinity of the junction. In the usual practice of growing such devices, the band gap decreases with growth across the entire width of the device as grown. It has been known that the composition and, therefore, the band gap of the material grown depends upon a number of parameters including the rate at which the temperature of the melt is decreased to cause the growth to occur.

Prior art patents and copending applications representative of the state of the art as summarized above are listed below:

(a) Pat. No. 3,302,051, issued Jan. 31, 1967 to S. V. Galginaitis;
(b) Pat. No. 3,333,135, issued July 25, 1967 to S. V. Galginaitis;
(c) Pat. No. 3,404,305, issued Oct. 1, 1968 to H. C. Wright;
(d) Pat. No. 3,456,209, issued July 15, 1969 to G. Diemer;
(e) Copending commonly assigned application Ser. No. 646,315, filed June 15, 1967 by H. S. Rupprecht and J. M. Woodall; and
(f) Copending commonly assigned application Ser. No. 767,742, filed Oct. 15, 1968 by M. R. Lorenz and A. H. Nethercot.

SUMMARY OF THE INVENTION

In accordance with the principles of the present invention, improved semiconductor diodes useful as electroluminescent devices are provided in which the band gap of the material is controlled across the entire width of the device to provide efficient light outputs in the visible portion of the electromagnetic spectrum. These diodes are grown by a liquid epitaxy or solution growth method and the material used in the preferred embodiment is gallium aluminum arsenide. The diodes are prepared so that in the recombination radiation region adjacent the junction the band gap is maintained at a constant value so that all the radiation is at the frequency corresponding to the energy of the constant band gap. Extending in both directions from the recombination radiation region to the two opposing surfaces of the device, which are essentially parallel to the junction, the band gap is at a higher value than in the constant recombination radiation region. Further, the band gap is controlled according to the application. To allow light transmission without undue losses in the material on both sides of the recombination radiation region, the composition of the material as grown is changed gradually so that the band gap increases gradually with distance away from the recombination radiation region. In this type of embodiment, abrupt changes in band gap and the accompanying abrupt changes in the index of refraction which could produce unwanted reflections are avoided. In other embodiments, abrupt changes in band gap are produced in one or the other regions which abrupt changes are used to produce desired reflections and/or to improve the injection efficiency in the desired direction across the p-n junction of the diode.

These types of devices are realized according to the method of the present invention by selectively controlling not only the temperature and the rate of temperature change used during the solution growth, but also by controlling the composition of the melt by adding controlled amounts of one of the elements to the melt at predetermined points during the growth process. Thus, in the preferred embodiment of the invention, using gallium aluminum arsenide as an example, the initial n region is grown on a gallium arsenide substrate merely by lowering the temperature at a rate which produces a gradual change in band gap. At the point at which the recombination radiation region is grown the temperature is decreased at a controlled rate and at the same time aluminum is added to the melt to allow the growth of the constant gap region desired for recombination radiation. Upon completion of this region, the remainder of the p type region is grown by maintaining the temperature constant and adding controlled amounts of aluminum to the melt from which the growth takes place. This produces a growth of material in which the band gap increases with additional growth. The rate at which this change in band gap occurs depends upon the rate at which aluminum is added to the melt and a gradual addition is employed to produce a gradual change. Where an abrupt change in band gap is desired, a larger amount of aluminum is introduced abruptly into the melt. The region of increasing band gap need not be grown isothermally, particularly where a relatively thick region is to be grown. Rather, the temperature may be decreased slightly to facilitate the growth as the aluminum is added. However, the rate at which the temperature is decreased must be carefully controlled relative to the rate of aluminum addition to ensure that the band gap increases.

Therefore, it is an object of the present invention to provide improved electroluminescent diodes as well as an improved method of preparing such diodes.

A further object is to provide more efficient electroluminescent diodes, and more particularly, diodes which efficiently emit light in the visible portion of the electromagnetic spectrum.

Still another object is to provide improved semiconductor electroluminescent diodes in which the band gap of the diodes throughout the entire width of the diodes is carefully controlled to produce the most efficient outputs for the application in which the diode is to be employed.

A further object is to provide a new and improved method of growing semiconductor alloy crystals and, particularly, alloy crystals which include at least three elements.

A more specific object is to provide a method of growing semiconductor alloy crystals by liquid phase epitaxy which allows for the selective production of regions of decreasing band gap, constant band gap, and increasing band gap and in which the rate at which changes in band gap are produced is controllable.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
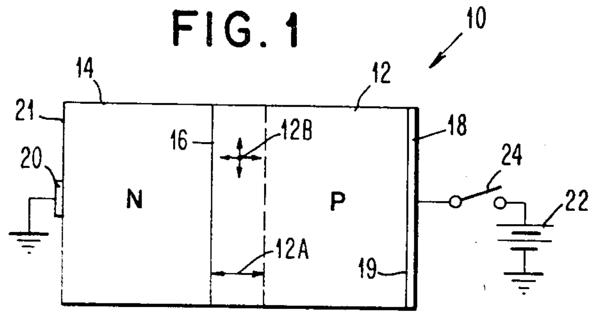
FIG. 1 is a schematic representation of an electroluminescent diode.

In the schematic representation of an electroluminescent diode shown in FIG. 1, the diode itself is designated 10 and includes a p region 12, an n region 14 and a p-n junction 16. Ohmic contacts 18 and 20 are connected respectively to the p and n regions 12 and 14 at opposing surfaces 19 and 21. A forward biasing voltage is applied across the diode through these ohmic contacts by a voltage source 22 under the control of a switch 24.

When the forward biasing voltage is applied, the light output of the device is produced primarily in a narrow portion of the p region 12 which is designated 12A. The light produced in this region results from the injection of minority carriers, here electrons, from n region 14 across junction 16, into the p region. These electrons, once injected, recombine with available holes in the p region and in the process of combining produce recombination radiation. The energy of this radiation is determined by the energy involved in the transition of the electrons recombining with the holes in region 12A. This energy generally corresponds to or is slightly less than the band gap, i.e. the energy difference between the bottom of the conduction band and the top of the valence band in the p region 12A adjacent the junction 16. When this recombination occurs, for example, at a point such as that labeled 12B, the light produced by the recombination travels in all directions as generally indicated by the arrows around point 12B.

In the embodiment of the diode 10 shown in FIG. 1, the light output is taken at the surface 21 at which the small contact 20 is connected so that very little of the light output is blocked at this surface. The light produced by the recombination radiation which travels in the opposite direction through the p region 12 is reflected at the electrode 19 so that it too can be passed through the entire length of the body to the surface 21. Light which passes through the upper and lower surfaces of the body as viewed in FIG. 1 can be collected by appropriate reflecting means so that all of the light output produced by the recombination radiation is focused in the desired direction.

One severe problem in the propagation of the recombination radiation in devices of the type shown in FIG. 1 is that the light, once produced, can be highly absorbed in travelling through the semiconductor material. This absorption can occur both in the n and p regions, but experience has shown that the p regions of such devices are usually much more absorbent than the n regions. In order to eliminate, insofar as is possible, such absorption due to the transition of electrons from the valence band to the conduction band, the energy of the band gap throughout the length of the device in FIG. 1 is carefully controlled. Specifically, the design is such that the band gap is essentially at a minimum in the region 12A where the recombination producing the radiation takes place. The band gap in the remainder of the diode structure extending from the recombination region 12A to both surfaces 19 and 21 is larger than the band gap in the recombination region. The width of the recombination region depends upon the doping levels, and for high doping levels, is very narrow. It is preferred that the band gap across this region be essentially constant so that the light which is produced has essentially the same energy or wavelength.

FIGS. 1A through 1E illustrate different variations in band gap which can be used in devices of the type shown in FIG. 1. These figures can be considered as generally representative of the band gap structures desired. In the preferred embodiment of the present invention, the material used in the diodes is the semiconductor alloy, GaAlAs. The n type dopant is tellurium, and the p type dopant is zinc. Further, in the preferred embodiment, the composition of this alloy is controlled in the preparation of the semiconductor body so that in the recombination radiation region 12A, the band gap is at about 1.86 electron volts and the light output is in the red and visible portion of the electromagnetic spectrum.

Figure 1D:
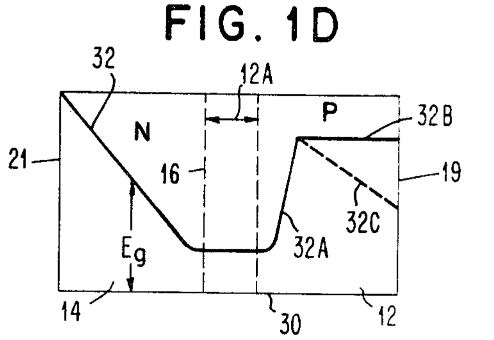
FIGS. 1A, 1B, 1C, 1D and 1E are plots depicting the energy gap in a diode, generally of the type shown in FIG. 1, for different embodiments of the diode constructed in accordance with the principles of the present invention.
Figure 1A:
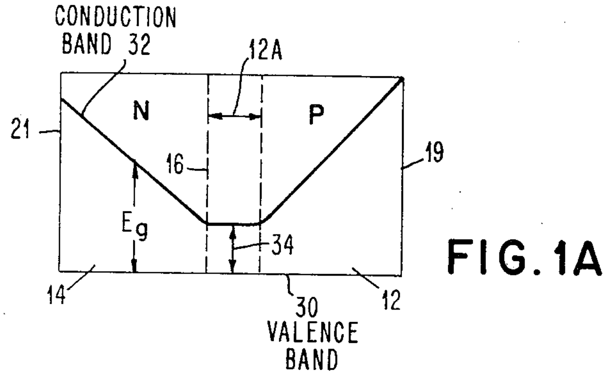

FIG. 1A is a somewhat idealized straight line representation of the variation in band gap for one embodiment of an electroluminescent diode prepared in accordance with the principle of the present invention. In this figure, reference numerals correspond to those used in FIG. 1 and are employed to facilitate understanding of the relationship between the two figures. In FIG. 1A, the valence band is represented at 30 as a straight line extending from left to right. The conduction band is represented by line 32, and it is this line which shows the variation in band gap $E_g$; that is, the energy difference at any point in the material between the conduction band and the valence band. Starting at the left in viewing FIG. 1A at the surface 21 of the device, it can be seen that the value of the band gap is rather large and decreases in value from left to right until the junction 16 is reached. The band gap thereafter remains at a constant value throughout the region 12A in which the recombination radiation is produced, and then is increased with distance to the right until the other surface 19 of the device is reached.

Arrow 34 located within the region 12A in FIG. 1A represents a recombination transition of an electron from the conduction band to the valence band within the semiconductor material. In the preferred embodiment of GaAlAs under consideration, such a transition has an energy of about 1.86 electron volts and produces a red and visible output. This light, once produced by a large number of such radiative transitions in the region 12A, propagates from right to left from region 12A to the surface 21 through n region 14 without any significant absorption since in this entire region the band gap is larger than the region 12A. Similarly, recombination radiation which propagates from region 12A to the right through the p region is not absorbed due to band to band transitions since throughout this entire region extending to the surface 19 the band gap of the p material is larger than the band gap in the recombination radiation 12A.

The light output may be taken at all of the surfaces of the body and reflected in one particular direction or, as described above, it may be reflected at surface 19 back through the device and taken only from the surface 21. In the latter case, there are some reflection losses and since the light in passing from the reflecting surface 19 to the other surface 21 must pass through recombination radiation region 12A where the band gap is at a minimum there will be some loss in passing through this region. However, the region in which the losses are produced is minimized to the absolute minimum width which is itself necessary to produce the recombination radiation. These losses can be further reduced by using impurities of a type which produce transitions which are less than the band gap in the region 12A.

Figure 1B:
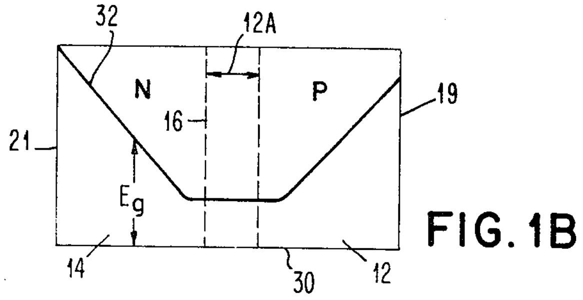

The band gap variation for another embodiment is illustrated in FIG. 1B. This embodiment differs from that of FIG. 1A only in that the portion of the device which has the minimum band gap extends over a slightly larger region than the recombination region 12A. Though this results in regions which produce higher absorption losses immediately adjacent the recombination region 12A, this type of structure is somewhat easier to fabricate since it allows for some variation in the exact position of the junction 16 as well as the position and width of the recombination radiation region 12. Again, as in the embodiment of FIG. 1A, in the remainder of the semiconductor body extending to both of the surfaces 19 and 21, the band gap is larger than and in the immediate vicinitiy of the junction and recombination radiation region.

Figure 1E:
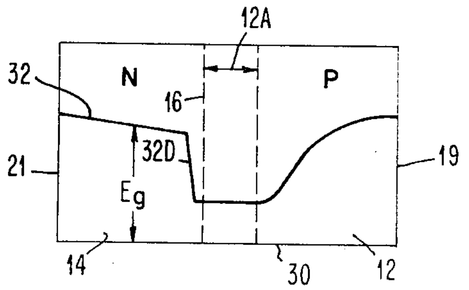
Figure 1C:
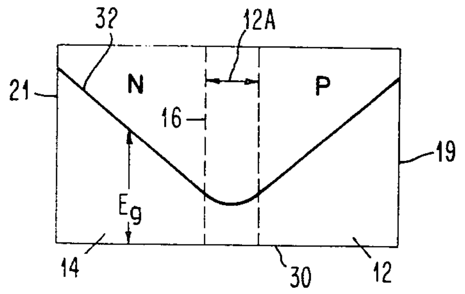

In the embodiment shown in FIG. 1C, the band gap structure is such that the portion of minimum band gap is narrower than the recombination radiation region 12A. This results in a larger spread in wavelength of the light output produced, but the structure retains the advantage of the higher band gap material in the remainder of the device. Further, it should be noted that the band gap variation is such that the band gap is diminishing when passing from the n region 14 across the p region 12 into the recombination region 12A. This type of variation is advantageous in improving the injection efficiency in the desired direction, that is, the injection of electrons from the n region 14 across the junction into the p region.

In FIGS. 1A, 1B and 1C, the band gap representation is shown to be linear, which is a largely idealized representation. However, it is important to note that the change in band gap as depicted is relatively gradual. The reason for this is that as the band gap is changed, the index of refraction also changes and, therefore, abrupt changes in band gap can product undesired reflections within the semiconductor body. However, this characteristic can be employed to advantage in producing internal reflection at a desired location within the semiconductor as illustrated in the embodiment of FIG. 1D.

In the embodiment having the band gap variation depicted in FIG. 1D, the band gap varies from the surface 21 through the n region, across junction 16 and including the recombination radiation region 12A in the same way as in the embodiment of FIG. 1A. The embodiment of FIG. 1D differs from that of FIG. 1A and the other embodiments described above in that in the p region 12, there is produced an abrupt change in the band gap at 32A. This abrupt change in band gap at this point is accompanied by an abrupt change in index of refraction and, therefore, an internal reflection interface is produced within the material. Light produced at recombination radiation 12A which propagates to the right is reflected at the interface represented at 32A back towards the surface 21 from which the light output can be taken. Therefore, the distance through which this light must travel is reduced and losses due to free carrier absorption and other phenomena which cannot be entirely eliminated are also reduced. The interface or abrupt change in band gap, and, therefore, in index of refraction, is preferably located a few diffusion lengths away from the junction 16 since, if this interface is too close to the junction, it may have the effect of causing more hole injection rather than electron injection at the junction with an attendant loss in efficiency. This follows from the fact that it is the electrons which are injected into the p region which produce the most efficient recombination radiation and, therefore, junctions in electroluminescent devices preferably are designed to have a high efficiency for electron injection rather than hole injection. Absent this type of a limitation, the interface may be moved very close to the junction to the point that it actually limits the width of the recombination radiation region. This type of design is more appropriate where the doping level near the junction is relatively low so that there is a wide recombination region which extends a distance from the junction into the p type region.

In the embodiment shown in FIG. 1D, the band gap is shown to extend at the minimum level of the recombination radiation region 12A to the point at which the abrupt change in band gap is produced at 32A. This type of design can result in absorption in this region which can be eliminated by fabricating the device so that the band gap rises gradually from the end of recombination radiation 12A to the abrupt change at 32A. Further after the abrupt change, the band gap, as represented by segment 32B, is shown to be maintained constant at the higher level or, as indicated at dotted segment 32C, actually decreases but remains above the minimum value in the recombination radiation region. This region of the diode in this structure with the reflection at interface 32A is not significant from a loss standpoint as is the case in the previous embodiments, but the band gap variations shown serve to illustrate that the band gap may be controlled to be constant or even to decrease in this portion of the diode to suit the demands of the application as well as the fabricating procedure. Thus, the constant higher band gap or decreasing band gap maintained above the minimum value may be used in the p regions of the embodiments shown in FIGS. 1A, 1B and 1C.

FIG. 1E illustrates a band gap variation in which an abrupt change in band gap and, therefore, index of refraction is produced very near the junction, but here this change is in the n region so that it improves the injection efficiency in the desired direction. The interface is here represented at 32D and in this embodiment, the ouput is taken at the surface 19. This is possible since the band gap in all regions outside recombination radiation region 12A is larger than in the recombination radiation region.

Figure 2:
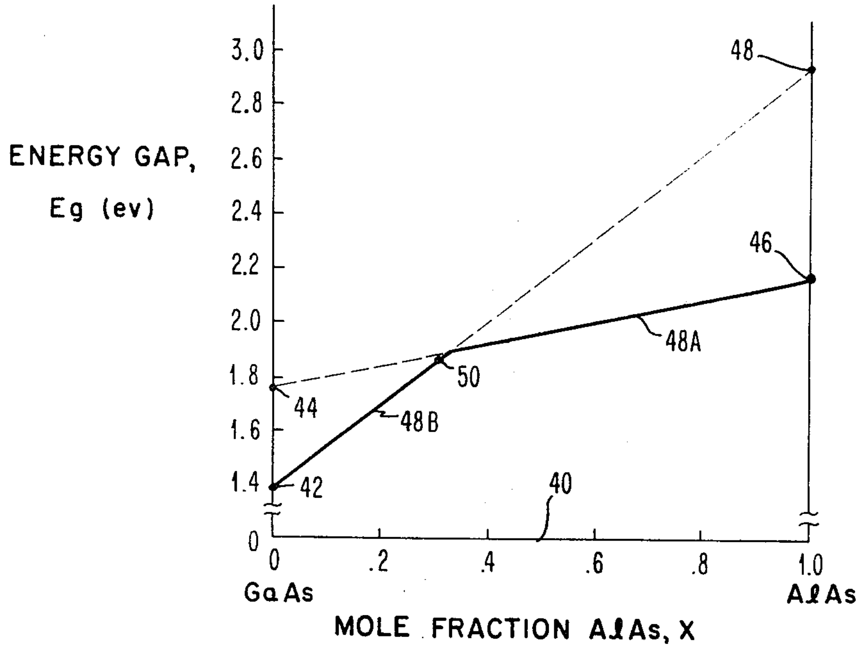
FIG. 2 is a plot depicting the relationship between energy gap and composition in the alloy gallium aluminum arsenide formed by combining the compounds gallium arsenide and aluminum arsenide.

In order to provide a clearer understanding of the material GaAlAs, and to provide a basis for a description of the manner in which a device such as those illustrated in FIGS. 1 and 1A through 1E are prepared, reference is made to FIG. 2 which illustrates the variation in band gap in this alloy according to the composition of the alloy. In FIG. 2, abscissa 40 represents the energy level of the top of the valence band in the alloy and the other line segments shown in dotted and full line form represent the lower edges of the direct and indirect conduction band minima in the material. GaAlAs can be considered to be an alloy of the two binary III–V compounds GaAs and AlAs. The energy gap characteristics for the compound GaAs are plotted along the left ordinate of the plot of FIG. 2 and the point 42 at 1.4 electron volts is representative of the fact that the lower edge of the lowest conduction band minima in GaAs is 1.4 electron volts above the upper edge of the valence band in this material. This minima is aligned in momentum space with the valence band minima and, therefore, GaAs is considered a direct gap material. The next lower conduction band minima in GaAs is at about 1.75 electron volts and is represented at point 44. Normally, the GaAs excess electrons are located in the lower conduction band minima, 1.4 electron volts above the valence band.

AlAs, the other component in the alloy, is an indirect gap material in that the lowest conduction band minima is not aligned in momentum space with the valence band and is about 2.15 electron volts above the valence band as indicated at point 46 along the right hand ordinate. The lowest direct conduction band in AlAs is indicated at point 48 and is located at about 2.86 electron volts above the valence band.

When alloys are formed of two such components, the band gap characteristics, in terms of whether the material is direct or indirect, and the actual width of the band gap can be controlled by controlling the composition of the alloy. The important consideration is the energy of the lowest conduction band minima which determines whether the particular alloy is a direct gap or an indirect gap material. In FIG. 2, the full line curves 48A and 48B represents the minimum band gap for changing compositions. For compositions along the line 48B, the material is a direct gap material and for compositions along the full line 48A, the alloy is an indirect gap material.

As pointed out above, according to the preferred practice of the present invention, the recombination radiation region of electroluminescent diodes has a band gap of about 1.86 electron volts which is at point 50 along curve 48B in FIG. 2. This point is chosen as to be in the direct gap range of compositions since direct gap transitions are, generally speaking, much more efficient in the production of light output than are indirect transitions. At the same time, the point 50 is chosen near the upper end of line 48B so that the light output is at as a wide band gap as possible and a red and visible to the human eye output is obtained.

Comparing FIG. 2 with the showing of FIG. 1A, therefore, it can be seen that the band gap in the region 12A is about 1.86 electron volts, as illustrated at 50 in FIG. 2. Further, the band gap increases extending in either direction from the recombination radiation region 12A quickly to the indirect transition compositions represented by line 48A in FIG. 2. This type of increase in band gap is advantageous not only in that the band gap in the regions on both sides of the recombination radiation region is wider, but also in that indirect band gap materials have been found to be less absorbing than direct gap materials.

The diodes of the present invention are preferably prepared by a solution regrowth method. In accordance with this method, vertical solution regrowth apparatus is employed which includes a container or crucible in which the materials to be grown are placed and heated to liquify them. A substrate seed crystal is then placed in contact with the liquid or melt, and the temperature thereafter controlled to epitaxially grow the crystal from the melt. The actual apparatus used in the device according to the present invention is described at length later in the specification with reference to FIGS. 4 and 4A.

Figure 3:
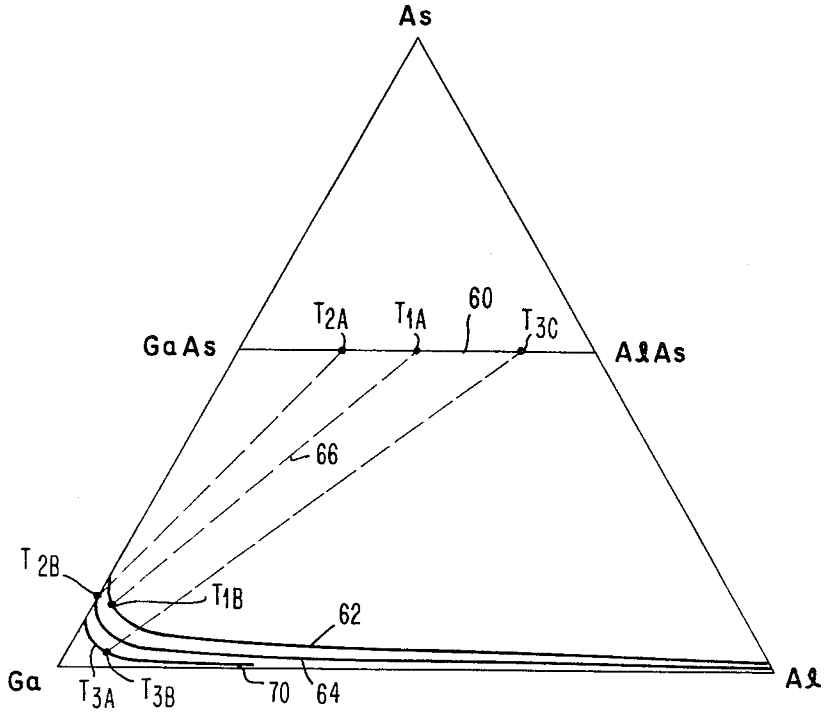
FIG. 3 is a phase diagram for gallium aluminum arsenide which is useful in understanding the manner in which the alloy gallium aluminum arenside is grown by a liquid phase epitaxial process.

For the present, reference is made to FIG. 3 in order to provide an understanding of the physical parameters involved in the growth of the semiconductor bodies for the use in the diodes of the present invention. FIG. 3 is a triangular coordinate type of phase diagrams useful in depicting the composition of the epitaxial material which is grown for the liquid melt under different conditions of temperature and composition in the melt. In one example of the practice of the present invention, the initial starting condition for the growth is represented at $T_{1A}$ in FIG. 3. $T_1$ is the temperature to which the materials from which the crystal is to be grown are first heated to form a liquid melt. Point $T_{1A}$ in FIG. 3 is on a line designated 60 which represents what is usually termed the solidus line in such a plot. Specifically, this line represents the composition of the solid material which can be epitaxially grown out of the melt. Three other lines designated 62, 64 and 70 are liquidus lines and these lines represent compositions of the liquid in the melt from which the solid may be grown. Lines 62, 64 and 70 are isothermal lines respectively for the temperature $T_1$, a second temperature $T_2$ and an even lower temperature $T_3$.

A line 66 is shown to connect the point $T_{1A}$ on solidus line 60 with point $T_{1B}$ on liquidus line 62 to demonstrate that under conditions of equilibrium at the temperature $T_1$ a composition represented at point $T_{1B}$ on line 62 in the melt will result in the growth of a solid having the composition represented at point $T_{1A}$ on line 60. The composition of the liquid is, of course, determined by the amounts of the constituents which are placed in the boat and first heated to the temperature $T_1$ before the growth operation is initiated. Point $T_{1B}$ on curve 62 in FIG. 3 represents a liquid mixture including about 93% gallium, 6% arsenic, and 1% aluminum. At this temperature, as represented by point $T_{1A}$ along the solidus line 60, a solid can be grown from this melt having a composition of 25% gallium, 50% arsenic, and 25% aluminum. These represent equilibrium conditions and growth, of course, will not continue unless the temperature is lowered. As the temperature is lowered, more of the material is grown but since the amount of the material grown is not in direct proportion to the amount in the liquid, the composition changes as the temperature is lowered. Thus, as the tempertaure is lowered from a temperature $T_1$, as represented at point $T_{1A}$ on line 60, to a lower temperature represented at a point $T_{2A}$ on this same curve, the composition grown becomes less rich in aluminum and more rich in gallium. The composition of the melt under these conditions is represented at point $T_{2B}$ on the isothermal liquidus line 64 for the temperature $T_2$. As represented at point $T_{2A}$ the grown composition under equilibrium conditions then includes 35% gallium, 50% arsenic, and 15% aluminum.

As thus far described, this is the conventional process for solution growth of alloy semiconductor bodies for semiconductor diodes. The semiconductor alloy crystal is grown on a substrate and, as it is grown, the band gap changes, as described, continuously from a higher value to a lower value. During the initial growth the melt includes an n type impurity such as tellurium so that the initial growth is n type, and at a certain point in the process a p type impurity is added to the melt so that the growth is thereafter p type and a p-n junction is formed. This conventional type of growth over the n type region is depicted in FIG. 1A by the portion of conduction band representing line 32 which extends from surface 21 to junction 16. The line is an idealized straight line representation since it illustrates the change sufficiently for the purposes of this disclosure. It should be understood that the rate of change in band gap is not always linear and is controlled by a number of factors including the rate at which the temperature decreases.

In the practice of the present invention, when the n type region 14 of FIG. 1A with the gradually decreasing band gap has been grown on the gallium arsenide substrate, as represented along the segment of line 60 in FIG. 3 between points $T_{1A}$ and $T_{2A}$, the process is then controlled to achieve the desired band gap structure in the remainder of the grown body. When the temperature has been lowered from temperature $T_1$ to temperature $T_2$, the solid equilibrium composition is represented at point $T_{2A}$ on line 60 and the liquid equilibrium composition is represented at point $T_{2B}$ on line 64. If the growth were continued merely by lowering the temperature at this point, the decrease in band gap would continue. However, in order to obtain the relatively constant minimum band gap in recombination radiation region 12A, more aluminum is added to the melt, on a relatively continuous basis and at the same time the temperature is lowered. The aluminum is added at a rate to compensate for the faster depletion of the aluminum from the melt so that as the temperature is lowered, a relatively constant composition and, therefore, constant band gap region 12B is grown.

The temperature change for this growth is represented in FIG. 3 by a change in the liquidus lines from isothermal line 64 for temperature $T_3$ to an isothermal line 70 for a slightly lower temperature $T_3$. These lines are equilibrium representations and illustrate the beginning and end conditions for the composition of the melt during this growth. The aluminum addition is reflected by a change along the line to the right. Proper control of the process results in a solid growth at point $T_{2A}$ due to the addition of aluminum as the temperature is lowered. The lines 62, 64, 70, as shown, are believed to provide a fair representation of the manner in which the changes occur but it should be emphasized that exact points in the left hand corner of the curve where changes occur abruptly are difficult to measure exactly, and measurements depend to a large degree not only on the actual system employed for growth but the manner in which the original constituents and additives are placed in the liquid container or boat. In any event, as shown, the temperature drop when accompanied by a gradual addition of aluminum produces a constant band gap growth. At the same time, the p type impurity, zinc, is added to the melt so that the material grown is p type and the junction 16 is located as shown in FIG. 1.

After the initial band gap material is grown, the temperature decrease is stopped at temperature $T_3$ and the process then reaches an equilibrium condition as represented by a point $T_{3A}$ on line 70 for the liquid and at point $T_{2A}$ on solidus line 60 for the solid. The growth of the final portion of the device, the p region, extending from the end of the recombination radiation region 12A to surface 19 as viewed in FIG. 1A is then carried out by maintaining the temperature constant at the temperature $T_3$ and gradually and continuously adding aluminum to the melt. Each addition of aluminum disturbs the equilibrium, moves the liquidus point to the right along isothermal line 70 for temperature $T_3$, and causes the growth or material richer in aluminum and, therefore, with a wider band gap than is present in region 12A. Though one might expect that if a certain amount of aluminum is added to the melt and the temperature maintained constant, the growth would continue until the added aluminum were used at which time the process would return to the original equilibrium condition, that is not the case. If aluminum is added to a liquid composition at equilibrium represented at a point on line 70 at a temperature $T_3$, growth is produced of more aluminum rich material represented by a movement to the right on solidus line 60. If the process is allowed to come to equilibrium, the new equilibrium condition, relative to the original equilibrium condition, is found to be moved to the right along both the lines 60 and 70.

The rate at which the composition changes and, therefore, the rate of increase in band gap is determined by the amount of aluminum which is added and the manner at which it is added. The isothermal growth may be continued for as long as is desired, for example, to reach the equilibrium condition represented at point $T_{3B}$ on liquidus line 70 and point $T_{3B}$ on solidus line 60. This latter point represents a grown composite of about 40% aluminum, 10% gallium and 50% arsenic; which is richer in aluminum and higher in band gap than the material at the surface 19 of FIGS. 1A through 1E. This type of growth is shown, however, in this plot to illustrate that sufficient aluminum can be added to grow by the isothermal process material which approaches the composition of aluminum arsenide.

All or part of the region of increasing band gap can also be grown by lowering the temperature and concurrently adding sufficient aluminum so that the desired band gap is achieved. Thus, the process here would differ from that used for growing gap material in the control of the rate of aluminum addition and/or temperature decrease.

It should also be noted that the finished devices whose band gap characteristics are represented in FIGS. 1A through 1E are not necessarily the semiconductor body as grown. The original wafer on which the liquid growth is produced is pure gallium arsenide and after the growth process, this wafer, which has a low band gap, is removed. In the removal process a portion of the initially grown material can also be removed. Similarly, the end or last portion of the device grown can be removed to a desired depth so that the band gaps at the surfaces 19 and 21 are not necessarily the band gaps of the material initially and finally grown during the liquid growth process.

To achieve the band gap variation shown in FIG. 1B, the same process as is described about is employed except that the time of constant band gap growth (temperature lowered from $T_2$ to $T_3$ while adding aluminum) is extended, and the p type impurity is not added to the melt until after some of this growth has been completed. To achieve the band gap variation depicted in FIG. 1C, a very short period for constant growth is employed. This entire step may be eliminated and after the initial growth from temperature $T_1$ to a lower temperature such as $T_2$, the isothermal growth of aluminum may be carried out at the latter temperature. The location of junction 16 is controlled, as before, by the time during the growth when the p type impurity is added to the melt.

In order to achieve the sharp interfaces shown in the embodiments of FIG. 1D at 32A, the process is modified by the addition of a large amount of aluminum to the melt at the proper time after the constant band gap region 12A is grown. When a large amount of alumium is added in this fashion, the growth process tends to gradually approach a relatively constant or even diminishing type of growth (line segments 32B, 32C) if the temperature is maintained constant and no additional aluminum is added to the melt. The growth of the crystal for the embodiment of FIG. 1E is similar to that used for the crystal having the band gap variation of FIG. 1D, except that here the growth is from right to left. The original impurity in the melt is zinc and the tellurium is added to the melt at the proper time to locate the p-n junction 16 in the position shown.

Particular note should be made of the fact that the abrupt changes in band gap, and in index of refraction, shown at 32A in FIG. 1D and 32D in FIG. 1E actually form heterojunctions in the body which present rectifying barriers to normal current flow in one direction through the body. Thus, in the embodiment of FIG. 1D, electrons injected across junction 16 cannot diffuse as minority carriers across p region 12 past the interface at 32A, and the only current flow is produced by the carriers which recombine to produce recombination radiation in the region 12A. In the embodiment of FIG. 1E, the arrangement is such, with the energy of the band gap decreasing sharply in the n region, that, as pointed out above, the injection efficiency of electrons for recombination radiation is improved.

Figures 4, 4A:
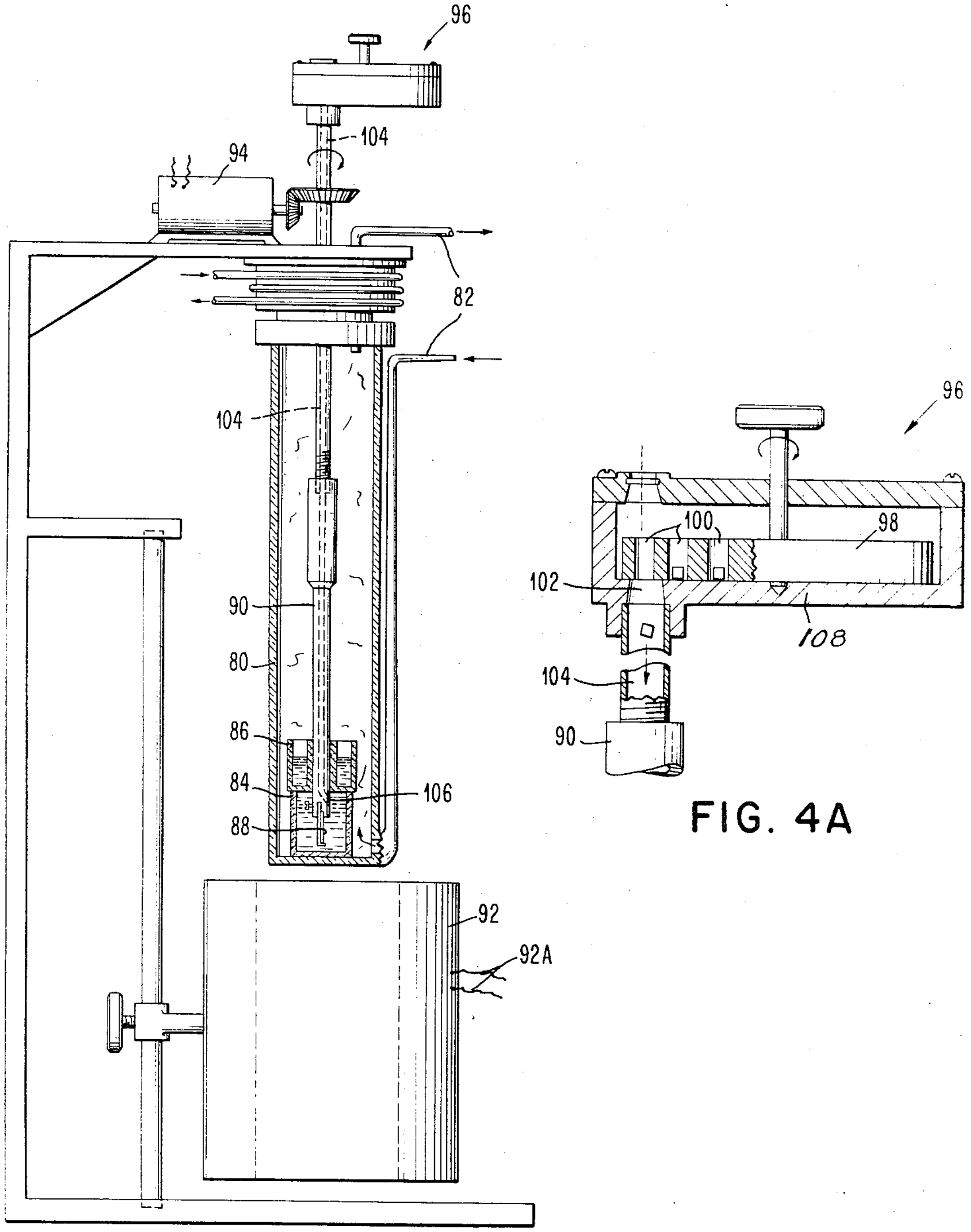
FIG. 4 is a somewhat schematic representation of a vertical solution growth apparatus used in growing semiconductor alloy crystals in accordance with the principles of the present invention.
FIG. 4A is an enlarged and more detailed view of the mechanism for feeding additional material into the melt-containing boat in the epitaxial growth apparatus of FIG. 4.

The apparatus used to grow the alloy crystals according to the method of this application is shown in FIGS. 4 and 4A. The apparatus is a conventional vertical growth apparatus with certain modifications to facilitate the practice of the method described above. The apparatus includes a chamber 80 which is evacuated prior to the growth and through which an inert gas is passed via tubular connections 82. A crucible 84 is placed in this chamber loaded with the proper amounts of GaAs, Al and tellurium. For example, three grams of GaAs are first placed in container; 5 milligrams of Te are added, and then 20 grams of Ga are placed on top of the GaAs and Te. The crucible is heated to melt the gallium which is then allowed to solidify, after which time 75 milligrams of Al are added. The crucible 84 is provided with a cover which carries in an annular chamber a gallium aluminum alloy which acts as an oxygen getter during the growth process. A gallium arsenide substrate 88 is mounted on a substrate holder connected to a long tube 90 which is in a manually raised or lowered. Initially, the tube 90 is in a raised position so that substrate 88 is above the crucible 84. A furnace 92 is manually raised to surround the charge in crucible 84. The temperature of the furnace is raised to heat the charge to a high enough temperature (e.g. 970° C.) to produce a melt. After a period of time to stabilize at this temperature, the temperature is lowered to 950° C. The tube 90 is then lowered to place the substrate 88 in the melt and the temperature is raised a few degrees (e.g. 950° C. to 960° C.). The furnace 92 is controlled by control means connected to leads 92A, but not shown, to lower the temperature and initiate the growth process. During the growth, the substrate 88 is rotated with tube 90 under the control of a motor 94. The temperature is lowered (e.g. 960° C. to 915° C. at 0.4° C. per minute) to produce the temperature decrease necessary for the growth of the structures of the type described above with the decreasing band gap structure.

The aluminum and zinc are added to the melt at the proper time in the growth process by a feeding mechanism shown generally at 96 in FIG. 4, and in more detail in FIG. 4A. It is sometimes preferable to actually raise the temperature two or three degrees after the zinc is added. The feeding mechanism includes a disc type pellet holder having a series of openings 100 arranged near its outer circumference into which pellets of the material to be added to the melt are placed. At the outer edge of this structure there is a connection via an opening 102 to an opening in tube 104 which extends through this tube to an exit 106 at a level in crucible 84 above the level of the melt. Thus, the amount and type of material to be added is determined by the size and content of the individual pellets placed in openings 100 in disc 98. As the disc is rotated, the inserted pellets are maintained in place by lower support 108 and the pellets in the opening aligned with the opening 102 are fed, as shown, into the melt. In this manner, by selecting the size of the pellets and the rate at which they are inserted by manual rotation of the disc, gradual or relatively large scale additions may be made to the melt.

The aluminum added may be in elemental form, or an aluminum compound may be used which dissolves more gradually in the melt. Aluminum alloy additions (e.g. gallium aluminum) may also be used. A typical rate for the isothermal growth of a gradually increasing band gap region at temperatures of about 915° C. is about 0.5 milligram of aluminum per minute. To grow the constant band gap material it is necessary to lower the temperature as the aluminum is added. Both the rate at which the temperature is lowered as well as the total change in temperature must be controlled relative to the rate and amount of aluminum added.

The temperatures, rate of decrease of temperature, and rate of increase of aluminum are sharply dependent upon a number of parameters of the actual system employed. Thus, for example, care is taken in the system of FIG. 4 by providing appropriate seals and the oxygen getting material in lid 86 to minimize the amount of free oxygen in the system, since the amount of aluminum available for growth is diminished by any oxide which is formed. Further, the manner in which the aluminum is added to the melt, for example is elemental form or as a compound or alloy, and the rate at which it dissolves and distributes also controls the amount actually grown. Also, the band gap of the grown material has been found to be dependent upon whether or not the rod 90 is rotated by motor 94 to stir the melt during the growth process.

Though the process as described above and the devices themselves have been embodied using gallium aluminum arsenide as the semiconductor material, it is, of course, obvious to one skilled in the art that the practice of the invention is not limited to this material, and the devices shown may be made using other semiconductors and various changes in the procedure employed. For example, the junction may be formed not during the regrowth process, but by diffusion after growth of the crystal, or when formed during the growth, an amphoteric dopant may be employed and the temperatures for the various steps controlled so that the junction is located at the desired location.

What is claimed is:

1. A method of growing ternary alloy semiconductor bodies for improved electroluminescent diodes by liquid phase epitaxy comprising the steps of:

(a) heating a mixture containing Ga, Al and As together with an impurity of given conductivity to a temperature sufficient to melt said mixture, said temperature being in a range of from about 950° C. to about 970° C., (b) inserting a GaAs substrate into said melt while raising the temperature of said melt from about 0.5° C. to about 10° C. to clean said substrate, said substrate being constantly rotated within said melt, (c) cooling said melt at a rate of about 0.4° C. per minute to a temperature sufficient to grow a first region of said body on said substrate wherein the band gap of said region decreases with continued growth, (d) adding Al and a second impurity having a conductivity opposite from that of said first impurity, into said melt while maintaining the temperature reached in step (c) to provide a region of constant band gap, and (e) further cooling said melt at a rate of about 0.4° C. per minute while continuously adding Al and said second impurity to grow a third region in which the band gap of said region increases with continued growth.

2. The method of claim 1 wherein said melt is cooled to about 915° C. in step (c).

3. The method of claim 2 wherein said first impurity is zinc and said second impurity is tellurium.

4. The method of claim 2 wherein said first impurity is tellurium and said second impurity is zinc.

5. A method of growing ternary alloy semiconductor bodies for improved electroluminescent diodes by liquid phase epitaxy comprising the steps of:

(a) heating a mixture containing Ga, Al and As to a temperature sufficient to melt said mixture, said temperature being in a range of from about 950° C. to about 970° C., (b) inserting a GaAs substrate into said melt while raising the temperature of said melt from about 5° C. to about 10° C. to clean said substrate, said substrate being constantly rotated within said melt, (c) cooling said melt at a rate of about 0.4° C. per minute to a temperature sufficient to grow a first region of said body on said substrate wherein the band gap of said region decreases with continued growth, (d) adding aluminum to said melt while maintaining the temperature reached in step (c) to provide a region of constant band gap, (e) further cooling said melt at a rate of about 0.4° C. per minute while continuously adding Al to said melt to grow a third region in which the band gap of said region increases with continued growth, and (f) diffusing impurities having opposite conductivities into said body to provide a p-n junction therein.

6. The method of claim 5 wherein said melt is cooled to about 915° C. in step (c).

References Cited

UNITED STATES PATENTS

| | | | |
|---|---|---|---|
| 3,278,342 | 10/1966 | John et al. | 148—1.6 |
| 3,302,051 | 1/1967 | Galginaitis | 313—108 D |
| 3,322,575 | 5/1967 | Ruehrwein | 136—89 |
| 3,333,135 | 7/1967 | Galginaitis | 313—108 D |
| 3,456,209 | 7/1969 | Diemer | 331—94.5 |
| 3,537,029 | 10/1970 | Kressel et al. | 317—234 X |
| 3,551,219 | 12/1970 | Panish et al. | 148—171 |

OTHER REFERENCES

Rupprecht et al.: "Efficient Visible Electroluminescence . . . Ga Al As . . ." Applied Physics Letters, vol. 11, No. 3, August 1967, pp. 81–83.

Ilegems et al.: "Derivation of the Ga-Al-As Ternary Phase. . . ." Symposium on Gallium Arsenide, 1968, pp. 3.

Panish et al.: "Ga-Al-As Phase, Thermodynamic and Optical Properties" J. Phys. Chem. Solids, vol. 30, January 1969, pp. 129–137.

Panish, M. B.: "The Ga-GaAs-Gap System: Phase Chemistry . . ." J. Phys. Chem. Solids, vol. 30, May 1969, pp. 1083–1090.

L. DEWAYNE RUTLEDGE, Primary Examiner

W. G. SABA, Assistant Examiner

U.S. Cl. X.R.

148—1.5, 1.6, 172, 173; 252—62.3 GA; 313—108 D; 317—235 R